(12) United States Patent
Otto et al.

(10) Patent No.: US 11,581,194 B2
(45) Date of Patent: Feb. 14, 2023

(54) SINTERING METHOD USING A SACRIFICIAL LAYER ON THE BACKSIDE METALLIZATION OF A SEMICONDUCTOR DIE

(71) Applicant: Infineon Technologies AG, Neubiberg (DE)

(72) Inventors: Frederik Otto, Recklinghausen (DE); Paul Frank, Villach (AT)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 17/167,620

(22) Filed: Feb. 4, 2021

(65) Prior Publication Data

US 2021/0242034 A1 Aug. 5, 2021

(30) Foreign Application Priority Data

Feb. 5, 2020 (DE) .................... 10 2020 102 876.8

(51) Int. Cl.
*H01L 21/324* (2006.01)
*H01L 23/31* (2006.01)
(Continued)

(52) U.S. Cl.
CPC ............ *H01L 21/324* (2013.01); *H01L 21/56* (2013.01); *H01L 23/293* (2013.01); *H01L 23/3192* (2013.01)

(58) Field of Classification Search
CPC ..... H01L 21/324; H01L 21/56; H01L 23/293; H01L 23/3192; H01L 24/29; H01L 24/03; H01L 24/05; H01L 24/32; H01L 24/75; H01L 24/94; H01L 2224/02215; H01L 2224/03003; H01L 2224/0345; H01L 2224/03826; H01L 2224/03827; H01L 2224/04026; H01L 2224/05083; H01L 2224/05124; H01L 2224/05155; H01L 2224/05166; H01L 2224/05639; H01L 2224/29294; H01L 2224/29339; H01L 2224/32227; H01L 2224/32245; H01L 2224/75251; H01L 2224/75252; H01L 2224/83002; H01L 2224/83055; H01L 2224/83192; H01L 2224/83203;
(Continued)

(56) References Cited

U.S. PATENT DOCUMENTS 9,928,947 B1 3/2018 Lee
2008/0116580 A1 5/2008 Jiang et al.
(Continued)

FOREIGN PATENT DOCUMENTS

DE 102008055134 7/2010
EP 3217424 9/2017

*Primary Examiner* — Thanh T Nguyen
(74) *Attorney, Agent, or Firm* — Dicke, Billig & Czaja, PLLC

(57) ABSTRACT

An electronic device comprises a semiconductor die, a layer stack disposed on the semiconductor die and comprising one or more functional layers, wherein the layer stack comprises a protection layer which is an outermost functional layer of the layer stack, and a sacrificial layer disposed on the protection layer, wherein the sacrificial layer comprises a material which decomposes or becomes volatile at a temperature between 100° and 400° C.

11 Claims, 3 Drawing Sheets

(51) Int. Cl.
*H01L 23/29* (2006.01)
*H01L 21/56* (2006.01)

(58) Field of Classification Search
CPC . H01L 2224/83208; H01L 2224/83439; H01L 2224/8384; H01L 2224/94; H01L 24/83; H01L 21/50; H01L 23/485; H01L 23/49534; H01L 24/27; H01L 2224/27001; H05K 13/046
See application file for complete search history.

(56) References Cited

U.S. PATENT DOCUMENTS

| | | | |
|---|---|---|---|
| 2010/0055839 A1 | 3/2010 | Nikitin | |
| 2011/0304985 A1 | 12/2011 | Rittner et al. | |
| 2012/0298170 A1 | 11/2012 | Lee et al. | |
| 2014/0159066 A1* | 6/2014 | Hu | H01L 24/75 438/28 |
| 2014/0167270 A1 | 6/2014 | Ganitzer et al. | |
| 2015/0187740 A1* | 7/2015 | McGroddy | H01L 33/14 345/82 |
| 2016/0336454 A1 | 11/2016 | Endo | |
| 2017/0317048 A1 | 11/2017 | Matsubara et al. | |
| 2018/0286734 A1* | 10/2018 | Meitl | B65G 47/91 |
| 2019/0264072 A1 | 8/2019 | Nitta et al. | |
| 2020/0058555 A1* | 2/2020 | Zhou | H01L 21/30608 |
| 2020/0176285 A1* | 6/2020 | Gomez | H01L 23/053 |

\* cited by examiner

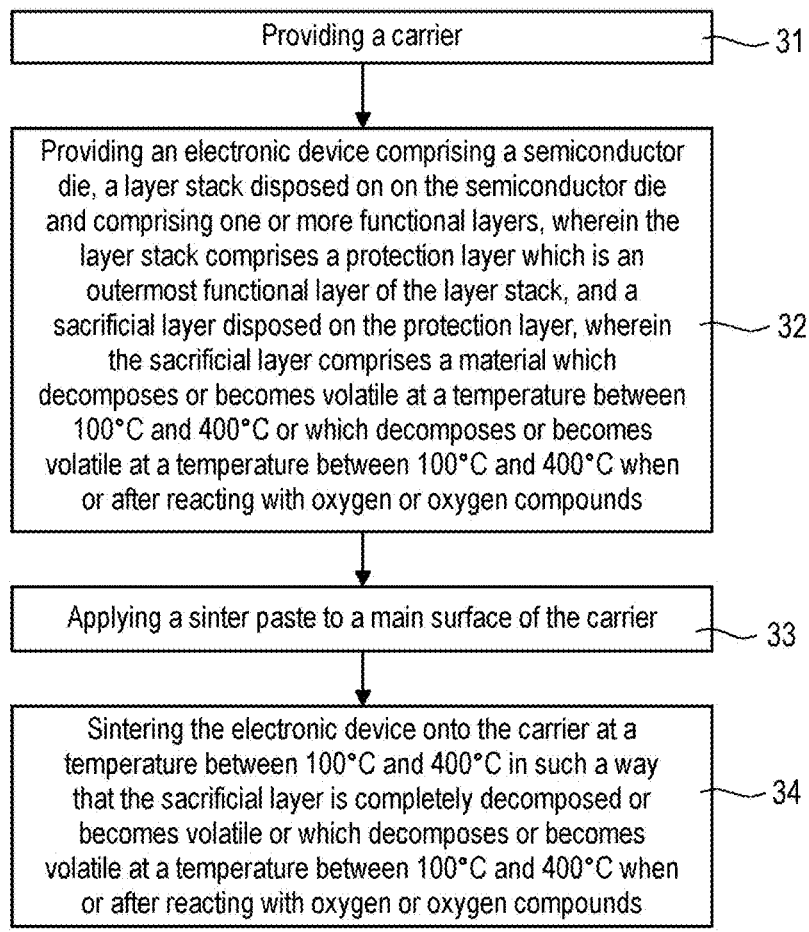
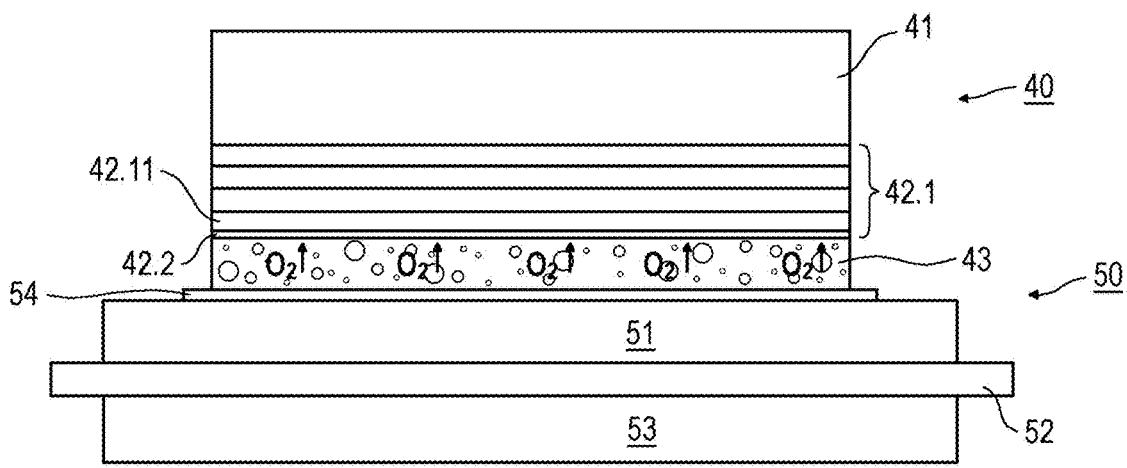

SINTERING METHOD USING A SACRIFICIAL LAYER ON THE BACKSIDE METALLIZATION OF A SEMICONDUCTOR DIE

CROSS-REFERENCE TO RELATED APPLICATION

This Utility patent application claims priority to German Patent Application No. 10 2020 102 876.8, filed Feb. 5, 2020, which is incorporated herein by reference.

TECHNICAL FIELD

The present disclosure is related to an electronic device, to a method for fabricating an electronic device, and to a method for fabricating an electronic module.

BACKGROUND

For fabricating electronic devices, very often semiconductor dies, semiconductor substrates or semiconductor wafers have to be mounted onto carriers like, for example, leadframes. The two most prominent methods nowadays employed in the semiconductor industry are soldering and sintering. The present disclosure relates to the sintering method in general. Sintering is known to have significant advantages over classical soldering processes in terms of the thermal and mechanical performance of the products.

SUMMARY

It has, however, recently been found out that sintering creates additional and previously unknown demands to the semiconductor dies used, and in particular to the backside metallization stack of the semiconductor dies. In particular, Ag thin films, which represent the terminating protection layer on many conventional die backside metallization stacks, can suffer from significant microstructural degradation when being exposed to oxygen at elevated temperatures which—in turn—can facilitate delamination or corrosion issues.

Therefore a need exists for the present disclosure.

A first aspect of the present disclosure is related to an electronic device, comprising a semiconductor die, a layer stack disposed on the semiconductor die and comprising one or more functional layers, wherein the layer stack comprises a protection layer which is an outermost functional layer of the layer stack, and a sacrificial layer disposed on the protection layer, wherein the sacrificial layer comprises a material which decomposes or becomes volatile at a temperature between 100° and 400° C.

A second aspect of the present disclosure is related to a method for fabricating an electronic device, the method comprising providing a semiconductor die, disposing a layer stack on the semiconductor die, the layer stack comprising one or more functional layers, wherein the layer stack comprises a protection layer which is an outermost functional layer of the layer stack, and disposing a sacrificial layer disposed on the protection layer, wherein the sacrificial layer comprises a material which decomposes or becomes volatile at a temperature between 100° and 400° C.

A third aspect of the present disclosure is related to a method for fabricating an electronic module, the method comprising providing a carrier, providing an electronic device comprising a semiconductor die, a layer stack comprising disposed on the semiconductor die and comprising one or more functional layers, wherein the layer stack comprises a protection layer which is an outermost functional layer of the layer stack, and a sacrificial layer disposed on the protection layer, wherein the sacrificial layer comprises a material which decomposes or becomes volatile at a temperature between 100° and 400° C., applying a sinter paste to a main surface of the carrier, and sintering the electronic device onto the carrier at a temperature between 100° C. and 400° C. in such a way that the sacrificial layer is completely decomposed or becomes volatile.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

FIG. 3 shows a flow diagram of a method for fabricating an electronic module according to the third aspect.

FIG. 4 shows a schematic cross-sectional side view representation of an intermediate product for illustrating a method for fabricating an electronic module according to the third aspect.

DESCRIPTION OF EMBODIMENTS

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

DETAILED DESCRIPTION

Figure 1:
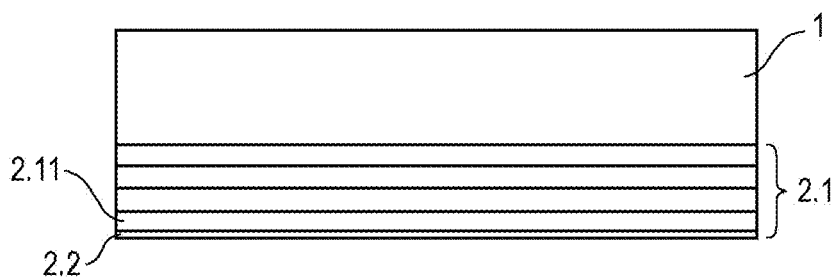
FIG. 1 shows a schematic cross-sectional side view representation of an electronic device according to the first aspect.

FIG. 1 depicts an electronic device according to the first aspect.

The electronic device 10 comprises a semiconductor die 1, a layer stack 2.1 disposed on the semiconductor die 1 and comprising one or more functional layers, wherein the layer stack 2.1 comprises a protection layer 2.11 which is an outermost functional layer of the layer stack 2.1, and a sacrificial layer 2.2 disposed on the protection layer 2.11, wherein the sacrificial layer 2.2 comprises a material which decomposes or becomes volatile at a temperature between 100° and 400° C.

Figure 2:
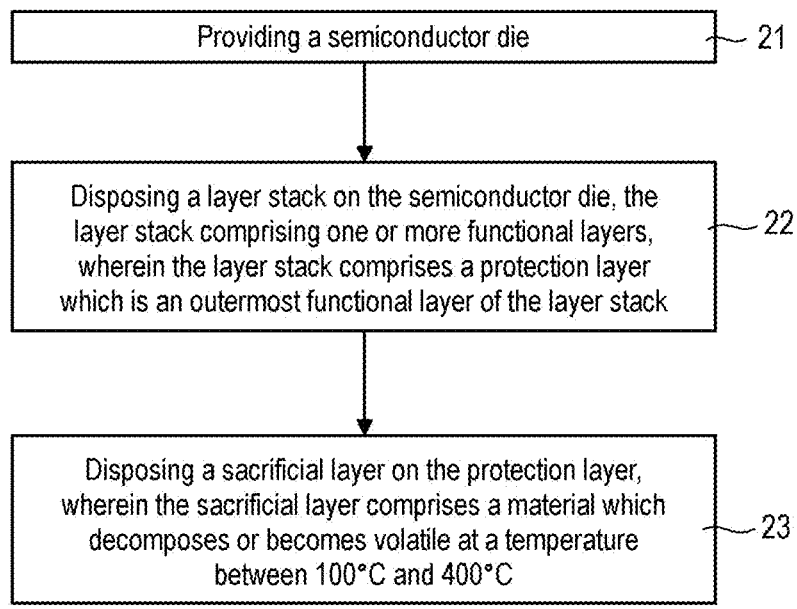
FIG. 2 shows a flow diagram of a method for fabricating an electronic device according to the second aspect.

FIG. 2 shows a flow diagram for illustrating a method according to the second aspect.

The method 20 of FIG. 2 comprises providing a semiconductor die (21), disposing a layer stack on the semiconductor die, the layer stack comprising one or more functional layers, wherein the layer stack comprises a protection layer which is an outermost functional layer of the layer stack (22), and disposing a sacrificial layer disposed on the protection layer, wherein the sacrificial layer comprises a material which decomposes or becomes volatile at a temperature between 100° C. and 400° C. (23), wherein the lower bound of the range can also be 150° C., 200° C., or 250° C., and the upper bound can also be 350° C., 300° C., or 250° C.

The method 20 of FIG. 2 can in particular be configured so as to fabricate an electronic device as depicted in FIG. 1, which electronic device will be explained in more detail in the following.

One feature of the present disclosure is the sacrificial layer which is added on top of the backside metallization stack, in particular deposited onto the terminating layer which can be, for example, an Ag layer. It is supposed to protect the semiconductor die or semiconductor dies of a wafer by preventing oxygen from ingressing into the backside metallization stack.

Different kinds of materials can be employed for the sacrificial layer. A potentially suitable layer material should fulfill one or more of the following features 1) to 5):

1) The material used is solid under typical environmental conditions at which semiconductor dies or wafers containing the semiconductor dies are stored or shipped after production.

2) The material used for the sacrificial layer is able to prevent oxygen from being able to adsorb to the terminating, e.g. silver, backside layer. This could happen by blocking attractive adsorption sites for oxygen on the backside terminating, e.g. silver, layer.

3) The material of the sacrificial layer becomes volatile when heated, two different mechanisms can be envisaged here:

a) The material reacts with oxygen and the reaction products are then volatile compounds.

b) The material itself becomes gaseous at elevated temperatures, i.e. it evaporates.

4) Independent of the exact nature by which the sacrificial layer becomes volatile (i.e. 3a or 3b), it is preferable that the evaporation and/or reaction occurs at a fairly well-defined temperature. This way, the stage at which the material is removed from the die backside during power module production can be controlled reliably.

5) If the material of the sacrificial layer reacts with oxygen, its reaction products are not harmful to the semiconductor assembly.

According to an embodiment of the electronic device or the method, the material of the sacrificial layer comprises carbon. Under elevated temperature processing in oxygen, the carbon would react with the surrounding oxygen to form carbon dioxide which is chemically inert and readily evaporates. Alternatively, inorganic materials like e.g. metals or non-metals are, in principle, also possible candidates as long as they do not interact with the semiconductor device and become volatile (in pure or oxidized form). According to a further example thereof, a thickness of the carbon, metal or non-metal sacrificial layer is in a range from 0.1 to 200 nm, wherein the lower bound can also be a thickness of a monolayer of the respective material, 0.5 nm, 1 nm, 2 nm, 5 nm, 10 nm, 20 nm, 30 nm, 40 nm, or 50 nm, and the upper bound can also be 180 nm, 160 nm, 140 nm, 120 nm, 100 nm, 80 nm, or 60 nm.

According to another embodiment of the electronic device or the method, the material of the sacrificial layer comprises organic molecules, in particular complex organic molecules, which could be applied to the layer stack. This could be done by thermal evaporation for instance. Two kinds of species can be envisaged which could be suitable here:

1) Organic species that are physisorbed to the termination layer of the layer stack, e.g. the Ag layer.

2) Organic species that are chemisorbed to the termination layer of the layer stack, e.g. the Ag layer.

The energies or—in our case—temperatures that are needed to remove the physi-/chemisorbed species from the termination layer are related to the chemical nature of the molecules. As a consequence, one can tailor the material for the sacrificial layer to the user's specific needs. Adjustments can, for example, be made by using a blend of different substances or pure substances with inherently different sorption strengths.

If organic species are used which adhere to the termination layer extremely well (chemisorption), oxidation of the organic species might precede or accompany desorption. Here the critical temperature for initiation of the oxidation reaction will dictate the temperature threshold above with the sacrificial layer will be removed.

In the following, several examples are given for organic substances that might be particularly suited as sacrificial layer. Of course, all other substances which meet the above-defined criterial are also possible.

1) Fatty acids. Under suitable conditions they tend to chemisorb to Ag surfaces. Their desorption temperature depends on the carbon chain length of the molecules as do the critical temperature and the degree of unsaturation for oxidative decomposition. This way, the volatilization/decomposition of the sacrificial layer can be easily fine-tuned. Furthermore, fatty acids are readily available and inexpensive.

2) Medium to long-chain hydrocarbons, such as alkanes. The desorption/evaporation kinetics depends on their respective carbon chain lengths, therefore enabling the user to fine tune the volatilization kinetics.

3) Polyethylene oxide (PEO) wax or polypropylene oxide (PPO) waxes which have an oxidation behavior similar to that of the hydrocarbons from items 1 and 2. Their rheological and hydrophilic properties can be tuned by partial oxidation and molecular weight distribution, which might be interesting for applying them to our wafer backsides.

4) The substances from item 3 with an additional amide functional group. This class of waxes can be adjusted from very soft to hard materials that differ from PEO and PPO waxes in their thermal and rheological properties.

According to a further example of the above described embodiment of employing organic molecules as sacrificial layer, a thickness of such a sacrificial layer is in a range from 0.1 nm to 10 nm wherein the lower bound can also be a thickness of a monolayer of the respective material, 0.2 nm, 0.3 nm, 0.4 nm, or 0.5 nm, 1 nm, or 2 nm, and the upper bound can also be 9 nm, 8 nm, 7 nm, 6 nm, or 5 nm.

Concerning the deposition of the sacrificial layer, in principle any method which allows for the deposition of homogeneous thin films with a well-controlled thickness onto a layer stack backside is suitable for the fabrication of the herein described sacrificial layers. Nevertheless, a few exemplary methods are listed in the following: Physical vapor depositions techniques (PVD) are commonly used in frontend for thin film deposition. Using PVD for deposition of the sacrificial layer, too, would make use of existing equipments and expertise (→commonality) and is deemed economically efficient. The same can be said for chemical vapor deposition techniques. Depending on the substance to be deposited, a simple thermal evaporation process might be the easiest and most economical way of fabricating the sacrificial layer.

A further option appears particularly attractive though as it would be the only way to add the sacrificial layer without introducing an additional process. It is briefly described here: Before dicing, the backsides of our wafers are commonly glued to a tape material which is itself fixed in a frame. After dicing, the aforementioned glue is treated using ultraviolet light to establish a degree of stickiness which, on the one hand, ensures safe handling of the diced wafers and, on the other hand, allows for fully-automated picking of the dies from the tape material during backend processing. It cannot be avoided that some of the glue material remains on the die backsides when being picked from the tape. These (organic) remains could also act as sacrificial layer in the sense of this invention if it is shown that it is possible to ensure sufficient and reproducible material transfer from the wafer tape to the die backsides.

According to an embodiment of the electronic device or the method, the protection layer, which is the termination layer of the layer stack, comprises an Ag layer.

According to an embodiment of the electronic device or the method, the layer stack comprises four layers. According to a further embodiment thereof, the layer stack comprises the following layer sequence following the semiconductor die, in particular the silicon die: an Al layer, a Ti layer, a layer comprising Ni, and an Ag layer. The layer comprising Ni can be, for example, a NiV layer or a NiSi layer.

FIG. 3 shows a flow diagram of a method for fabricating an electronic module.

The method 30 of FIG. 3 comprises providing a carrier, providing an electronic device comprising a semiconductor die, a layer stack comprising disposed on the semiconductor die and comprising one or more functional layers, wherein the layer stack comprises a protection layer which is an outermost functional layer of the layer stack, and a sacrificial layer disposed on the protection layer, wherein the sacrificial layer comprises a material which decomposes or becomes volatile at a temperature between 100° and 400° C. (32), applying a sinter paste to a main surface of the carrier (33), and sintering the electronic device onto the carrier at a temperature between 100° C. and 400° C. in such a way that the sacrificial layer is completely decomposed or becomes volatile (34).

During the fabrication of the electronic module in oxygen-containing environments, the sacrificial layer protects the die backside metallization stack by preventing oxygen from being able to adsorb to the terminating layer. This protective effect lasts as long as the sacrificial layer is present. In the course of the further fabrication of the module, the sacrificial must, however, be removed in order to enable the creation of a good material-bonded interconnect between die and sinter layer.

According to an embodiment of the method 30 of FIG. 3, the carrier comprises one or more of a portion of a leadframe, a direct copper bond (DCB), an active metal braze (AMB), or an isolated metal substrate (IMS).

According to an embodiment of the method 30 of FIG. 3, sintering is carried out at a temperature in a range from 150° C. to 350° C., wherein the lower bound can also be 200° C. and the upper bound can also be 300° C.

FIG. 4 shows a schematic cross-sectional side view representation of an intermediate product for illustrating a method for fabricating an electronic module.

In particular, FIG. 4 depicts an electronic device 40 which is to be connected to a carrier 50. The electronic device 40 comprises a semiconductor die 41, a layer stack 42.1 disposed on the semiconductor die 41 and comprising one or more functional layers, wherein the layer stack 42.1 comprises a protection layer 42.11 which is an outermost functional layer of the layer stack 42.1, and a sacrificial layer 42.2 disposed on the protection layer 42.11, wherein the sacrificial layer 42.2 comprises a material which decomposes or becomes volatile at a temperature between 100° and 400° C.

The layer stack 42.1 may comprise the following sequence of layers: silicon die 41, Al layer, Ti layer, NiV or NiSi layer, Ag layer 42.11, sacrificial layer 42.2.

FIG. 4 further shows a sinter paste layer 43 disposed between the electronic device 40 and the carrier 50. The carrier 50 is an active metal braze (AMB) substrate comprising a first upper Cu layer 51, a second lower Cu layer 53 and an intermediate dielectric layer 52. An Ag plating layer 54 is disposed on top of the first upper Cu layer 51.

FIG. 4 schematically illustrates the diffusion of O2 molecules through the sinter paste layer 43 until they reach the sacrificial layer 42.2 where they react with the constituents of the material of the sacrificial layer 42.2.

The sinter paste layer 43 may comprise a fine powder of silver flakes and the whole assembly may be compacted under the combined action of temperature and pressure. The process of compaction may be commonly executed in an anvil-punch setup wherein the assembly is placed between a heated punch and a heated anvil which introduce the mechanical pressure and the temperature. The temperature can be in a range from 200° C. to 300° D'C and then pressure can be in a range from 5 to 30 MPa, and the processing time can be in a range from 1 min. to 60 min. The anvil-punch setup is not shown here for reasons of clarity.

Depending on the choice of material for the sacrificial layer, different removal behaviors could be exploited. These are schematically explained below. It is emphasized that the examples represent simplified cases; in reality, mixed behavior should be expected.

Figure 5A:
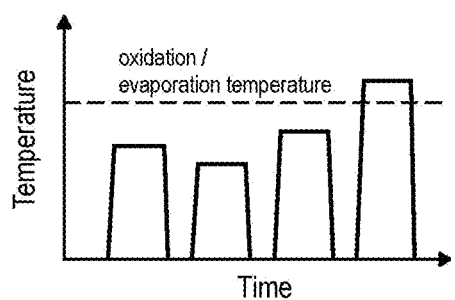
FIG. 5 comprises FIGS. 5A and 5B and shows a diagram of temperature vs. time (A) and a diagram of amount of sacrificial layer left vs. time (B) for illustrating a hypothetical processing sequence for a sacrificial layer material which oxidizes or evaporates at a discrete temperature.
Figure 5B:
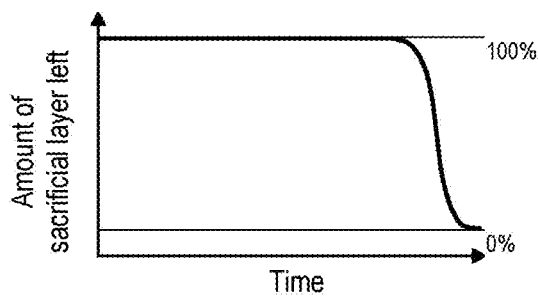

FIG. 5 comprises FIGS. 5A and 5B and illustrates a discrete removal kinetics. In particular, FIG. 5A shows a diagram of temperature vs. time (A) and a diagram of amount of sacrificial layer left vs. time (B) for illustrating a hypothetical processing sequence for a sacrificial layer material which oxidizes or evaporates at a discrete temperature.

Envision a sacrificial layer that has a well-defined temperature at which it either evaporates or reacts with surrounding oxygen (and then evaporates). Now envision that this layer is being exposed to a sequence of temperature steps (for example different packaging processes) in oxygen-containing atmospheres. Under these conditions the sacrificial layer remains virtually unaltered until a process is performed at a temperature higher than the discrete oxidation/evaporation temperature. As soon as this critical temperature is reached, the sacrificial layer will be removed. Such a hypothetical sequence of temperature steps is sketched in FIG. 5A where the discrete oxidation/evaporation temperature of the sacrificial layer material is highlighted by the dashed black line. In addition, FIG. 5B also contains a corresponding mass loss curve that illustrates the removal kinetics of the sacrificial layer in the form of its mass loss as a function of time. As was described above, no mass loss is observed during the first three temperature steps as there are performed at temperatures that are too low to cause oxidation/evaporation of the sacrificial layer. Material removal is, however, quick as soon as the critical temperature is exceeded, i.e. during the fourth temperature step. Such behavior would be expected for processes where the discrete oxidation/evaporation temperature represents the threshold between two stable, thermodynamic states. An example would be the boiling of water which—for a given pressure—occurs at a well-defined temperature above which water is stable in the gaseous form and below which water is stable in liquid form. Of course, the phase transition kinetics would still possess some temperature dependence (i.e. the degree of superheating); this might be negligible though for materials which have a high vapor pressure or are very reactive.

In terms of the material oxidation/evaporation schemes sketched in the previous section, it would be expected that a thin carbon layer would show a "discrete" type of behavior.

Figure 6A:
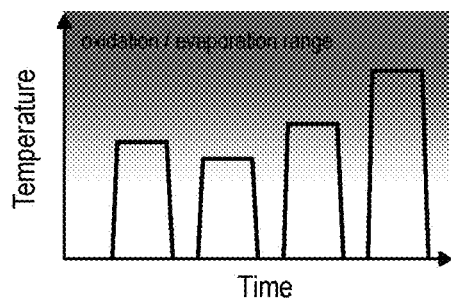
FIG. 6 comprises FIGS. 6A and 6B and shows a diagram of temperature vs. time (A) and a diagram of amount of sacrificial layer left vs. time (B) for illustrating a hypothetical processing sequence for a sacrificial layer material which oxidizes or evaporates over an extended temperature range.
Figure 6B:
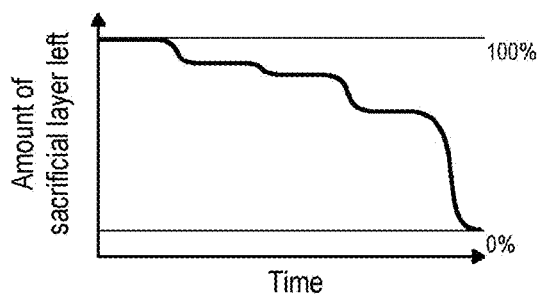

FIG. 6 comprises FIGS. 6A and 6B and illustrates a continuous removal kinetics. In particular, FIG. 6 comprises FIGS. 6A and 6B and shows a diagram of temperature vs. time (A) and a diagram of amount of sacrificial layer left vs. time (B) for illustrating a hypothetical processing sequence for a sacrificial layer material which oxidizes or evaporates over an extended temperature range.

Envision the same sequence of temperature steps as in the previous example. This time, however, there is an extended temperature range in which oxidation/evaporation occurs. This would, for example, be true if the critical temperature above which oxidation/evaporation is energetically feasible is relatively low, but the rate of oxidation/evaporation is strongly temperature activated. In this case, slow oxidation/evaporation will already occur at low temperatures but accelerate strongly when the temperature is increased. In this case, the material removal will be spread out over several temperature steps in the form of multiple, temperature-dependent increments. Such a scenario is depicted in FIG. 6A, where the same temperature profile as that of FIG. 5A is shown. A temperature range is highlighted where the removal rate of the sacrificial layer is represented by a grey tone coding; the darker the grey tone gets, the higher is the removal rate. The corresponding mass loss curve in FIG. 6B illustrates that—in this case—the mass loss would occur in multiple steps. The mass loss increment for each temperature steps is related to the absolute temperature; for a given time increment, a high temperature process will result in a higher mass loss due to oxidation/evaporation than a low temperature process.

The answer to the question which of the above-described oxidation/evaporation behavior is preferable might vary with the specific processing sequence considered. As that may be, the terminating Ag layer in the die backside metallization stack will be protected from oxygen ingress as long as there is sufficient sacrificial material present.

Example 1 is an electronic device comprising a semiconductor die, a layer stack disposed on the semiconductor die and comprising one or more functional layers, wherein the layer stack comprises a protection layer which is an outermost functional layer of the layer stack, and a sacrificial layer disposed on the protection layer, wherein the sacrificial layer comprises a material which decomposes or becomes volatile at a temperature between 100° and 400° C.

In Example 2, in the subject matter of Example 1 the material of the sacrificial layer optionally comprises carbon.

In Example 3, in the subject matter of Example 1 the material of the sacrificial layer optionally comprises a metal.

In Example 4, in the subject matter of Examples 2 or 3, a thickness of the sacrificial layer is in a range from 0.1 nm or monolayer thickness to 200 nm.

In Example 5, in the subject matter of any one of the preceding Examples, the material of the sacrificial layer comprises one or more of organic molecules and/or fatty acids.

In Example 6, in the subject matter of Example 5, a thickness of the sacrificial layer is in a range from 0.1 to 10 nm.

In Example 7, in the subject matter of any one of the preceding Examples the protection layer comprises Ag.

In Example 8, in the subject matter of any one of the preceding Examples the layer stack comprises four layers.

In Example 9, in the subject matter of Example 8 the layer stack comprises the following layer sequence following the semiconductor die: an Al layer, a Ti layer, a layer comprising Ni, and an Ag layer.

Example 10 is a method comprising providing a semiconductor die, disposing a layer stack on the semiconductor die, the layer stack comprising one or more functional layers, wherein the layer stack comprises a protection layer which is an outermost functional layer of the layer stack, and disposing a sacrificial layer disposed on the protection layer, wherein the sacrificial layer comprises a material which decomposes or becomes volatile at a temperature between 100° and 400° C.

In Example 11, in the subject matter of Example 10 the material of the sacrificial layer optionally comprises carbon.

In Example 12, in the subject matter of Example 10, the material of the sacrificial layer optionally comprises a metal.

In Example 13, in the subject matter of Example 11 or 12 a thickness of the sacrificial layer is in a range from 0.1 nm or monolayer thickness to 200 nm.

In Example 14, in the subject matter of Example 10 the material of the sacrificial layer comprises one or more of organic molecules and/or fatty acids.

In Example 15, in the subject matter of Example 14, a thickness of the sacrificial layer is in a range from 0.1 to 10 nm.

In Example 16, in the subject matter of any one of the preceding Examples the sacrificial layer is disposed by foil-assisted application.

Example 17 is a method for fabricating an electronic module, the method comprising providing a carrier, providing an electronic device comprising a semiconductor die, a layer stack comprising disposed on the semiconductor die and comprising one or more functional layers, wherein the layer stack comprises a protection layer which is an outermost functional layer of the layer stack, and a sacrificial layer disposed on the protection layer, wherein the sacrificial layer comprises a material which itself decomposes or becomes volatile at a temperature between 100° and 400° C. or which decomposes or becomes volatile at a temperature between 100° C. and 400° C. when or after reacting with oxygen or oxygen compounds, applying a sinter paste to a main surface of the carrier, and sintering the electronic device onto the carrier at a temperature between 100° C. and 400° C. in such a way that the sacrificial layer itself is completely decomposed or becomes volatile or which decomposes or becomes volatile at a temperature between 100° C. and 400° C. when or after reacting with oxygen or oxygen compounds.

In Example 18, in the subject matter of Example 17 the carrier comprises one or more of a portion of a leadframe, a direct copper bond (DCB), an active metal braze (AMB), or an isolated metal substrate (IMS).

In Example 19, in the subject matter of Example 17 or 18 sintering is carried out at a temperature in a range from 150° C. to 350° C.

In Example 20, in the subject matter of Example 19 sintering is carried out at a temperature in a range from 200° C. to 300° C.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A method for fabricating an electronic device, the method comprising:
   providing a semiconductor die;
   disposing a layer stack on the semiconductor die, the layer stack comprising one or more functional layers, wherein the layer stack comprises a protection layer which is an outermost functional layer of the layer stack; and
   disposing a sacrificial layer on the protection layer, wherein the sacrificial layer comprises a material which decomposes or becomes volatile at a temperature between 100° and 400° C.

2. The method according to claim 1, wherein the material of the sacrificial layer comprises carbon.

3. The method according to claim 2, wherein a thickness of the sacrificial layer is in a range from 0.1 nm or monolayer thickness to 200 nm.

4. The method according to claim 1, wherein the material of the sacrificial layer comprises a metal.

5. The method according to claim 1, wherein the material of the sacrificial layer comprises one or more of organic molecules and/or fatty acids.

6. The method according to claim 5, wherein a thickness of the sacrificial layer is in a range from 0.1 to 10 nm.

7. The method according to claim 1, comprising disposing the sacrificial layer on the protection layer by foil-assisted application.

8. A method for fabricating an electronic module, the method comprising:
   providing a carrier;
   providing an electronic device comprising a semiconductor die, a layer stack comprising disposed on the semiconductor die and comprising one or more functional layers, wherein the layer stack comprises a protection layer which is an outermost functional layer of the layer stack, and a sacrificial layer disposed on the protection layer, wherein the sacrificial layer comprises a material which itself decomposes or becomes volatile at a temperature between 100° and 400° C. or which decomposes or becomes volatile at a temperature between 100° C. and 400° C. when or after reacting with oxygen or oxygen compounds;
   applying a sinter paste to a main surface of the carrier; and
   sintering the electronic device onto the carrier at a temperature between 100° C. and 400° C. in such a way that the sacrificial layer itself is completely decomposed or becomes volatile or which decomposes or becomes volatile at a temperature between 100° C. and 400° C. when or after reacting with oxygen or oxygen compounds.

9. The method according to claim 8, wherein the carrier comprises one or more of a portion of a leadframe, a direct copper bond (DCB), an active metal braze (AMB), or an isolated metal substrate (IMS).

10. The method according to claim 8, wherein sintering is carried out at a temperature in a range from 150° C. to 350° C.

11. The method according to claim 10, wherein sintering is carried out at a temperature in a range from 200° C. to 300° C.

* * * * *